United States Patent [19]

Griessman et al.

[11] Patent Number: 5,341,431
[45] Date of Patent: Aug. 23, 1994

[54] AM STEREO DETECTION AND AUDIO PROCESSING APPARATUS

[75] Inventors: Detlef Griessman; Gregory J. Manlove, both of Kokomo; Thomas G. Block, Carmel; Gordon P. Howlett, Greentown, all of Ind.

[73] Assignee: Delco Electronics Corporation, Kokomo, Ind.

[21] Appl. No.: 954,721

[22] Filed: Oct. 1, 1992

[51] Int. Cl.5 .............................................. H04H 5/00
[52] U.S. Cl. ...................................... 381/15; 455/266; 455/265; 329/306; 329/360; 331/DIG. 2
[58] Field of Search ................... 381/15; 455/266, 265; 329/306, 360; 331/DIG. 2

[56] References Cited

U.S. PATENT DOCUMENTS

| | | | |
|---|---|---|---|
| 3,525,945 | 8/1970 | Puente | 331/DIG. 2 |
| 4,205,272 | 5/1980 | Kumagai | 455/266 |
| 4,377,728 | 3/1983 | Hilbert | 179/1 |
| 4,525,686 | 6/1985 | Yokoya | 329/360 |
| 5,014,316 | 5/1991 | Marrah et al. | 381/15 |

Primary Examiner—Curtis Kuntz
Assistant Examiner—Mark Kelly
Attorney, Agent, or Firm—Anthony L. Simon; Jimmy L. Funke

[57] ABSTRACT

A synchronous AM detector and processor requiring a reduced number of external components and fewer integrated circuit pins comprises an audio processor having a first filter operation controlled by a control voltage and an AM stereo decoder including a lock detector and a phase locked loop having a second filter operation controlled by the control voltage. A single control node is coupled to the audio processor and the phase locked loop, the control node providing the control voltage for the audio processor and the phase locked loop. The voltage at the control node is biased normally high, capable of being pulled low by the audio processing circuit and capable of being pulled low by the lock detector. An RC circuit decays the rise time of the control voltage at the control node after the control voltage has been pulled low. Circuitry is added to control the first filter operation of the audio processing circuitry responsive to the control voltage at the control node. Additional circuitry is added to control the second filter operation of the phase locked loop in response to the control voltage level.

5 Claims, 7 Drawing Sheets

AM STEREO DETECTION AND AUDIO PROCESSING APPARATUS

The subject of this invention is related to the subject of U.S. patent application, Ser. No. 07/954,997, entitled "Out-of-Lock Detector for Synchronized AM Detection," filed on Oct. 1, 1992, assigned to the assignee of this invention and the disclosure of which is incorporated herein by reference; this invention is also related to the subject of U.S. Pat. No. 5,151,939, filed Mar. 21, 1990, and to the subject of U.S. Pat. No. 5,014,316, both assigned to the assignee of this invention and having disclosures of which are incorporated herein by reference.

This invention relates to AM stereo signal processing and more particularly to synchronous AM signal processing.

BACKGROUND OF THE INVENTION

Synchronous AM detection has distinct advantages over non-synchronous detection due to improved signal-to-noise performance under poor signal conditions. Modern synchronous AM detectors comprise a combination of integrated circuitry and external components and are more cost effective when the number of external components and of necessary integrated circuit pins are minimized.

Referring to FIG. 1, a standard AM receiver that decodes C-QUAM (Compatible Quadrature Amplitude Modulation) is shown. The receiver shown in FIG. 1 is described in U.S. Pat. Nos. 5,014,316 and 5,151,939 referred to above.

In the standard receiver shown in FIG. 1, an input signal is received at antenna 210, converted to an IF signal in front end circuit 212 and amplified by the IF amplifier 214. AM stereo decoder 256 receives the signal from IF amplifier 214, comprising the signal that was modulated in C-QUAM at the AM stereo broadcaster and which must now be decoded. Envelope detector 216 receives the amplified IF signal and outputs a signal, E, on line 12 comprising 1+L+R, where L represents the left channel signal and R represents the right channel signal of the AM stereo signal.

The amplified IF signal is also input to variable gain amplifier 219, whose gain is controlled by the output of amplifier 217 (explained below). The output of gain circuit 219 is coupled to in-phase detector (IDET) 218 and quadrature phase detector (QDET) 220. QDET 220 acts as the phase detector for phase lock loop 226. The output of QDET 220 is coupled to loop filter 224 in phase locked loop 226, for now bypassing the +1/−1 gain block 320. The output of loop filter 224 is coupled to voltage controlled oscillator (VCO) 222.

IDET 218 and QDET 220 are synchronous detectors and receive in-phase (0°) and quadrature (90°) inputs respectively from VCO 222. Lacking in the signal correction, the output signals from IDET 218 and QDET 220 would be (1+L+R)cosine($\theta$) and (L-R)cosine($\theta$), labeled I (synchronously detected in-phase signal) and Q (synchronously detected quadrature-phase signal) on lines 14 and 16 respectively.

The output I of IDET 218 goes through gain block 318, described below, and is coupled to the input of amplifier 217, which amplifies the difference between the output I on line 14 and the output E on line 12 and provides that amplified difference to variable gain amplifier 219. This feedback circuit forces the corrected I output on line 14 to be equal to the E output of 1+L+R on line 12, forcing the gain of gain stage 219 to equal 1/cosine($\theta$). Since the output of variable gain stage 219 is also coupled to QDET 220, this forces the output Q on line 16 to be equal to L-R.

The outputs I and Q of IDET 218 and QDET 220 are input to matrix and audio processing circuitry 233, where base band audio left and right signals are produced. Circuitry 233 is discussed in detail in pending U.S. Pat. No. 5,151,939, referred to above.

Frequency detector 319 and +1/−1 gain blocks 318 and 320 help phase lock loop 226 quickly lock onto AM signals. Frequency detector 319 looks at the output I of IDET 218 at the zero crossings of the output signal Q of (QDET 220. If the output I of IDET 218 is positive at the zero crossings of the signal Q, both of the +1/−1 gain blocks 318, 320 invert the I and Q signals output from IDET 218 and QDET 220. If the signal I is negative with respect to AC ground at the zero crossings of the signal Q, the +1/−1 gain blocks do not invert the I and Q signals output from IDET 218 and QDET 220.

In phase locked loop 226, the resonator for VCO 222 is typically accurate to approximately plus or minus 3 kHz. This forces phase locked loop 226 to lock plus or minus 3 kHz. If phase locked loop 226 has a band width of only 5 Hz, it cannot lock over the desired frequency range of VCO 222.

Frequency detector 319 allows the circuit to lock over the desired frequency range. The frequency detector 319 and gain circuits 318 and 320 are responsive to the I and Q signals. The position of I, when the Q signal goes to zero volts, is used to flip the I and Q signals. This provides a non-zero DC voltage to the loop filter 224 of the phase locked loop 226 and allows the phase lock loop to acquire lock over the whole frequency range of the VCO 222.

The prior art circuit shown in FIG. 1 allows phase lock loop 226 to lock, but the lock times are on the order of seconds when it is preferable to tune the AM band with lock times of less than 100 milliseconds. To increase the lock speed to a time of less than 100 milliseconds, a variable band width phase locked loop is used. Typically, the control for the variable band width phase locked loop uses a relatively long time constant while varying the band width of the filter from broad to narrow to assure acquisition of the incoming AM signal. This long time constant requires use of an external component such as a large capacitor, therefore requiring the addition of a pin to the integrated circuit and an external component to the circuit board, both of which increase the price of the circuitry.

Referring to FIG. 2, the audio processing circuitry shown is described in detail in U.S. Pat. No. 5,151,939, referred to above. The audio processing circuit 233 includes variable corner frequency low pass filters 102 and 103 and variable Q notch filters 106 and 107.

The variable low pass filters 102 and 103 perform two functions. The first function of variable low pass filters 102 and 103 is to supply additional attenuation to the base band edge, which is needed since new radio systems use wider IF filters to improve the fidelity of the AM signal. The second function of variable low pass filters 102 and 103 is to provide control over the amount of 10 kHz band width information seen by notch filter 107 and thus seen by the 10 kHz signal detector comprising high 0 band pass filter 110 and comparator 111. (10 kHz is the United States spacing between AM radio stations. In Europe, the station spacing is 9 kHz. The filter characteristics in AM receivers correspond to the broadcast format of the country in which the radio is to be used. In this document, when the term 10 kHz is used, it is understood that the value 10 kHz corresponds to the United States AM station spacing, and that for applications in countries in which the station spacing is not 10 kHz, the correct station spacing is to be substituted.)

The variable Q notch filter 107 provides a band pass output that is fed to the high Q 10 kHz band pass filter 110. The resultant output from the high Q 10 kHz band pass filter 110 is an isolated 10 kHz signal whose relative strength indicates the presence of an adjacent channel.

The output from high Q 10 kHz band pass filter 110 is provided to the non-inverting input of comparator 111, which produces pulses at its output having a width that vary as a function of the relative amplitude of the output of filter 110 and the value of the reference voltage on the inverting input of comparator 111. The varying pulse width output from comparator 111 is coupled through transistor 120 and resistor 122 to capacitor 126, thereby controlling the voltage CVOL at node 15, which is equal to the voltage across capacitor 126.

The voltage CVOL is used to control the variable low pass filters 102 and 103 and the variable Q notch filters 106 and 107. This closed loop scheme precisely limits the amount of 10 kHz information representing adjacent channel information present in the signal path. When no 10 kHz signal information is detected, the loop widens the response of low pass filters 102 and 103 and notch filters 106 and 107 to allow for maximum fidelity of the desired signal. However, when a strong adjacent channel is detected, the loop narrows the signal path band width to eliminate the interference. This is done at the expense of desired fidelity.

The voltage CVOL is also used to control the variable attenuator 104 and the left minus right signal path which performs the blend-to-mono function. Attenuator 104 is active in the range of CVOL from 3 volts to 1.5 volts. The low pass and notch filters are active in the range of CVOL from 4 volts to 1.5 volts. The different functions are all controlled by the single control voltage CVOL over different ranges of CVOL voltages. Other flags that can pull down CVOL are ACG and excess I, which provide information about the signal quality to control circuits 112 in a manner well known to those skilled in the art.

The scheme provided through control voltage CVOL is fast attack-slow decay. The 10 kHz signal or the signal provided by the control circuits through transistor 128 and resistor 130 can quickly reduce the voltage CVOL. The slow decay time is necessary to avoid any quick fluctuations in and out of audio processing that may irritate the listener. The slow decay function is derived from a large RC time constant requiring a large resistor value for resistor 127 and a large capacitor value for capacitor 126, which is typically an external tantalum capacitor to minimize leakage current. A long time constant is also needed for the phase lock loop to lock on to the signal.

What is desired is a control for the AM stereo decoder circuitry that provides all of the necessary functions with minimum part count and minimum external pin count.

SUMMARY OF THE PRESENT INVENTION

This invention provides a circuit apparatus for an AM stereo decoder that ties control of the phase locked loop into the control voltage of the audio processing circuitry. The circuit apparatus of this invention provides the advantages of reduced IC pin count, savings in circuit board space and elimination of certain external components.

Structurally, the apparatus of this invention comprises an AM stereo decoder circuit having a control node with a control voltage capable of being reduced by various signals such as an isolated 10 kHz signal in an audio circuitry, an excess I signal, a microprocessor control signal and an out-of-lock flag signal, wherein the control voltage is coupled to a band width control in the phase locked loop in the AM stereo decoder circuit. The control voltage is characterized with a fast response and a slow decay.

A more detailed description of this invention, along with various embodiments thereof, is set forth below.

DETAILED DESCRIPTION OF THE INVENTION

Figure 3:
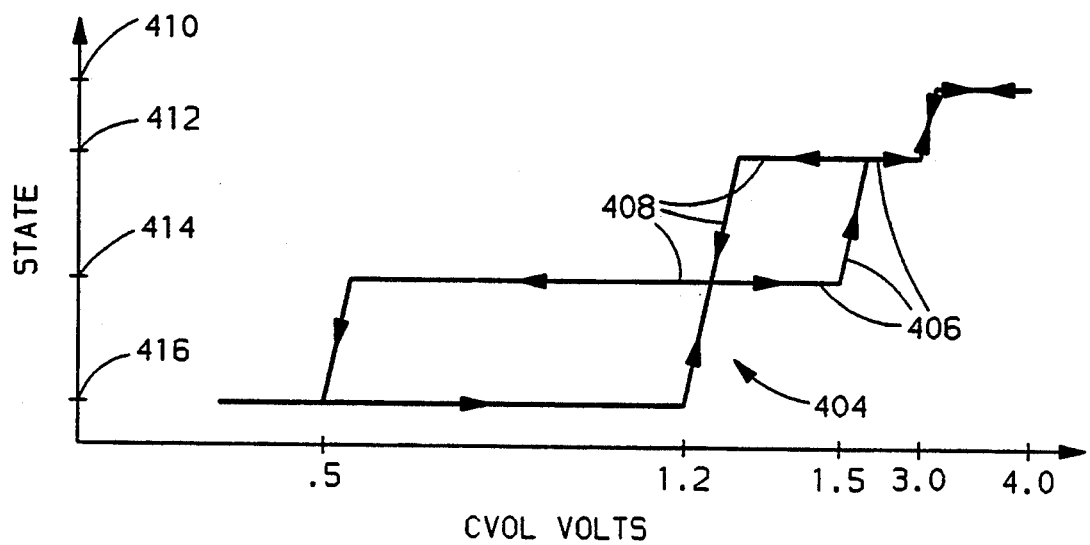
FIG. 3 is a diagram of AM stereo decoder control versus control node voltage according to this invention.

Referring to FIG. 3, the graph shown generally represents the control states of the apparatus of this invention compared with the control voltage CVOL at the control node 84 according to this invention. Trace 404 generally represents the control path with portion 406 representing the part of the control path followed during increasing control voltages or the slow decay of the control voltage node and with portion 408 representing the part of the control path followed during decreasing voltages or fast attack of the control node.

In general, during a lock condition, the control voltage is at a level represented by 410, 4 volts (also equal to AC ground). Control of the stereo receiver requires no special signal processing during the locked condition. When the control voltage falls below 1.5 volts, at level 412, the circuit switches into the second control state, at which the phase lock loop remains in narrow band width operation, while the frequency detector remains inactive, the stereo light remains enabled, the variable band width low pass and notch filters 102, 103, 106 and 107 are active and variable attenuator 104 is active.

When the control voltage falls below 1.2 volts, level 414, the third control state is reached in which the phase locked loop 226 is switched to medium frequency band width operation. Frequency detector 319 remains inactive and the stereo light (not shown) is disabled.

When the control voltage falls below 0.5 volts, level 416, the fourth control state is reached, in which phase locked loop 226 is switched to wide frequency band width operation and frequency detector 319 is activated. The stereo light remains disabled.

When phase lock loop 226 locks back onto a signal, the control voltage CVOL at the control node begins rise. When the control voltage rises to 1.2 volts, level 414, the system changes to the third state at which phase lock loop 226 is switched to the medium band width, the frequency detector is switched off and the stereo light remains disabled.

As the control voltage rises to 1.5 volts, level 412, the system changes to the second control state where phase locked loop 226 switches to narrow band width operation, frequency detector 319 remains inactive, the stereo light is enabled, the variable band width low pass and notch filters 102, 103, 106 and 107 and blend attenuator 104 are active. As control voltage CVOL rises to 4 volts, phase lock loop 226 is in full locked condition and there is no audio processing by phase lock loop 226 or frequency detector 319 to re-attain lock, or by the variable low pass and notch filters 102, 103, 106, and 107, or attenuator 104.

Figure 4:
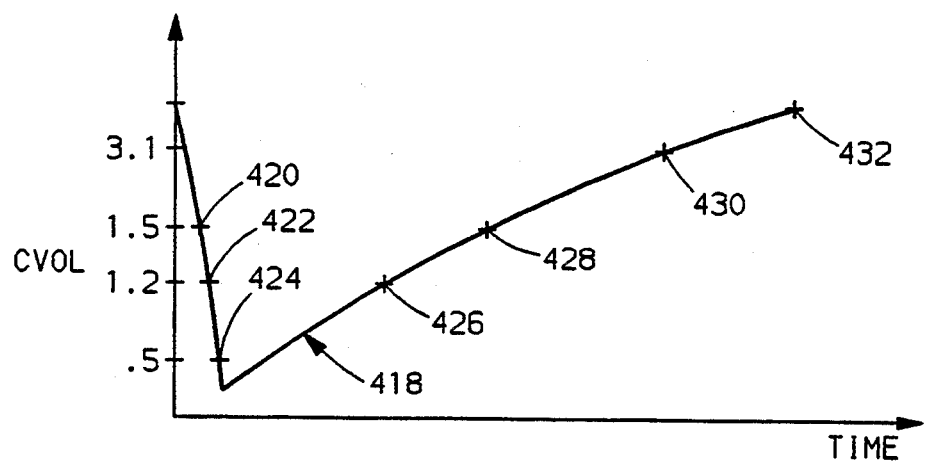
FIG. 4 is a graph illustrating the fast attack-slow decay action of the control voltage according to this invention.

Referring to FIG. 4, trace 418 shows the fast attack-slow decay (settling) of this invention as controlled by the control voltage CVOL at the control node. Typically, when signal lock is lost, the control voltage rapidly decreases (in a first direction) through points 420, 422 and 424. Point 420 corresponds to level 412 in FIG. 3, point 422 corresponds to level 414 and point 424 corresponds to level 416. In the slow decay (settling, in a second direction), point 426 corresponds to level 414, point 428 corresponds to level 412 and point 432 corresponds to level 410.

Figure 1:
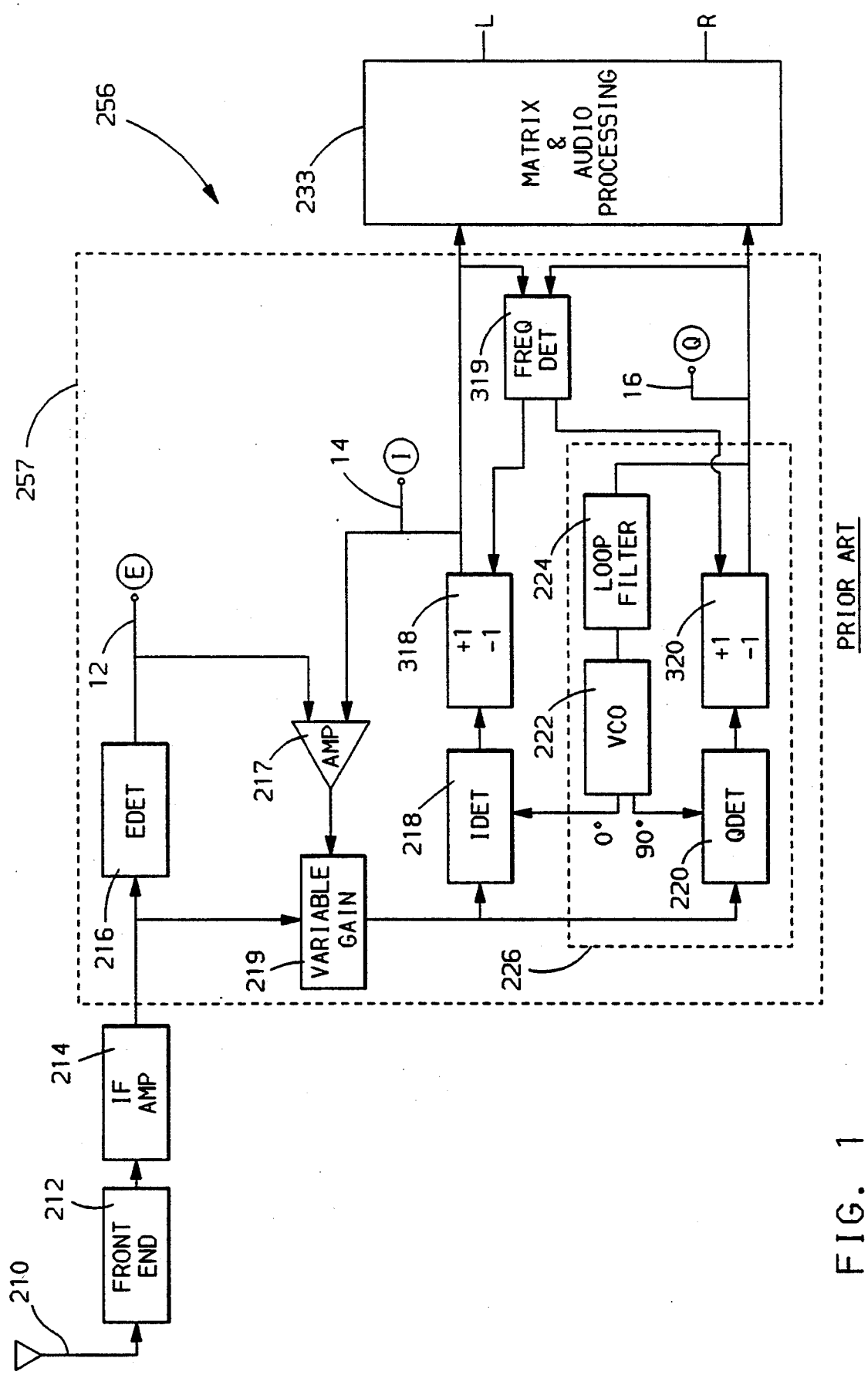
FIG. 1 is an illustration of a prior art AM stereo decoder.
Figure 2:
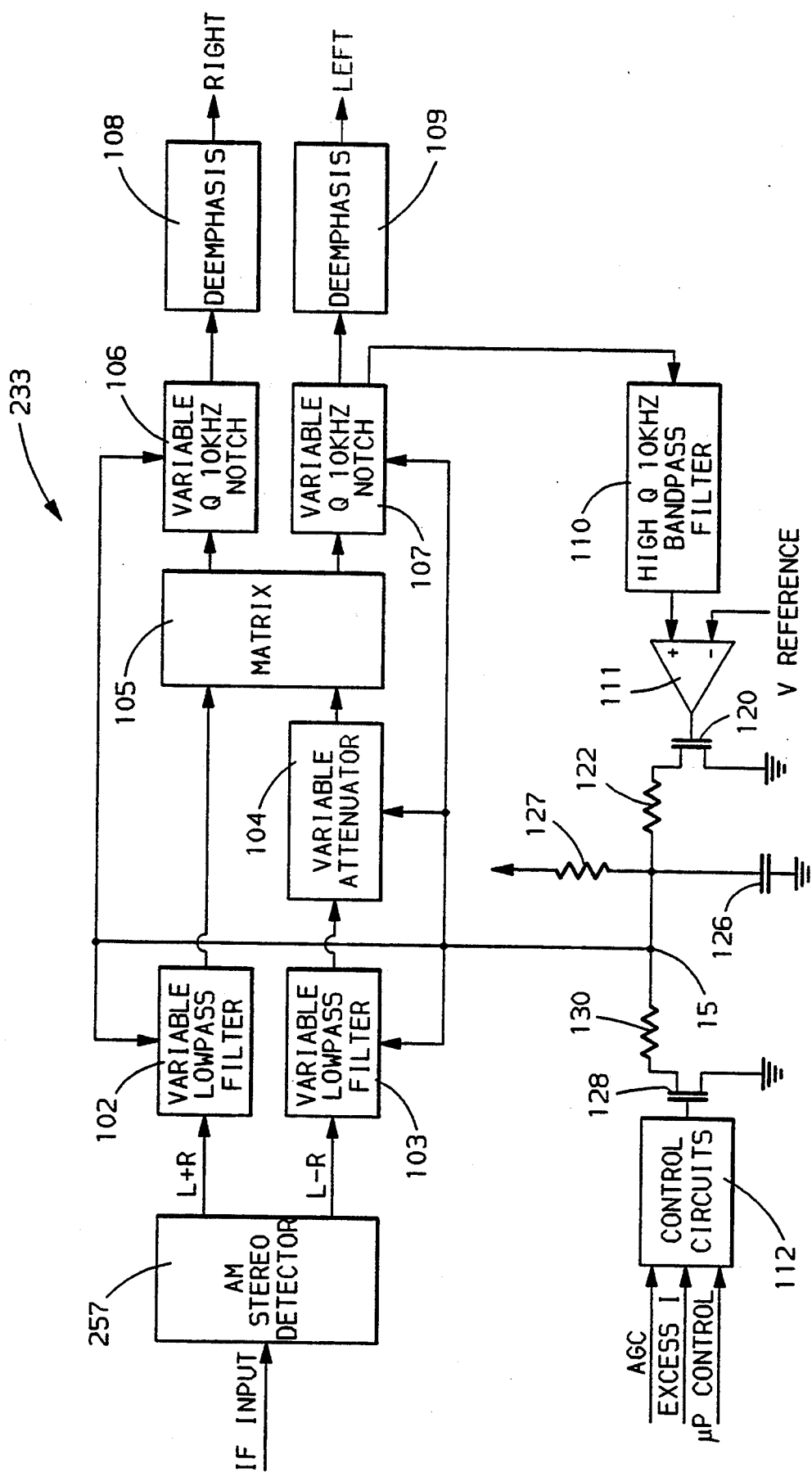
FIG. 2 is an illustration block diagram of a prior art adaptive audio processor.
Figure 5:
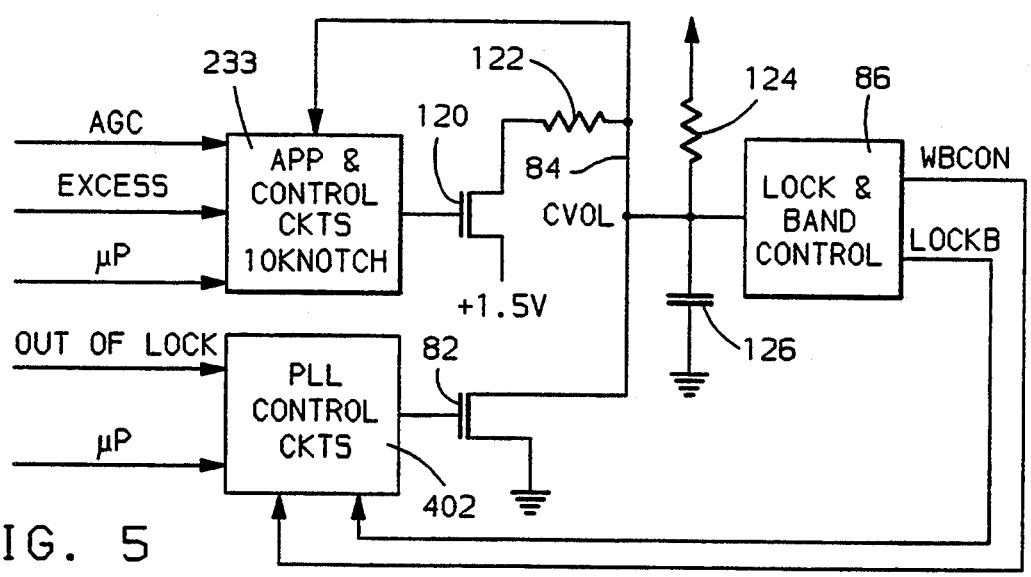
FIG. 5 illustrates the apparatus of this invention.

Referring to FIG. 5, the structure of this invention is shown. Audio processing signal control circuit 233 which is shown in more detail in FIG. 2, provides the output through transistor 120 to the control node 84. Transistor 120 is coupled to a 1.5 volt supply so that the control circuit 233 is capable of bringing control voltage CVOL at node 84 down to the 1.5 voltage level and switch the circuit between the control states at level 412, FIG. 3.

Figure 6:
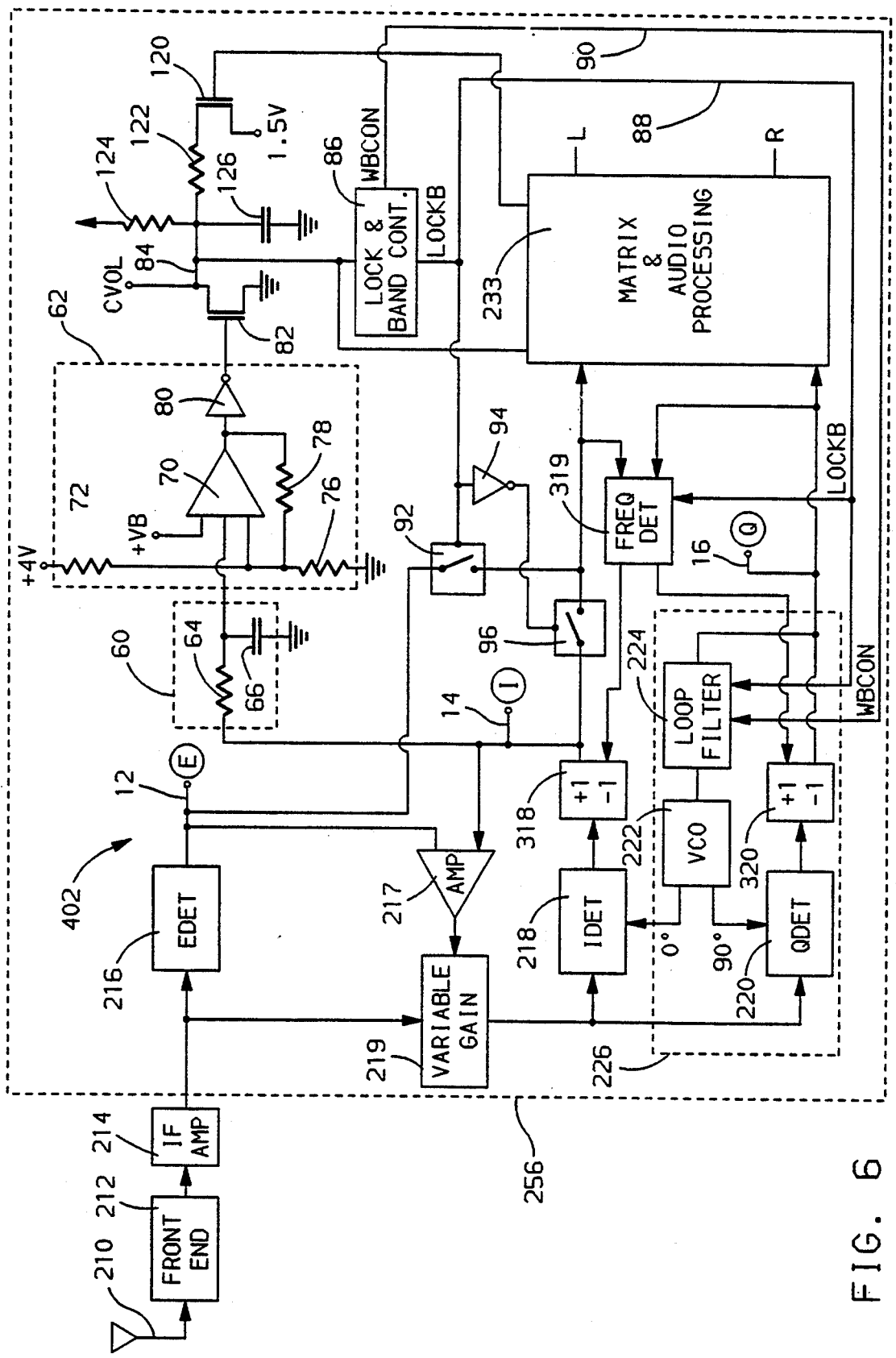
FIG. 6 is a more detailed description of the apparatus of this invention.

Phase lock loop control circuit 402 is shown in more detail in FIG. 6 and described in copending U.S. patent application Ser. No. 07/954,997, filed on Oct. 1, 1992 referenced above. Phase lock loop control circuit 402 includes an out-of-lock detector (described in detail in application, Ser. No. 07/954,997), filed on Oct. 1, 1992 which provides a control signal to transistor 82, which in turn pulls control node CVOL down to zero volts when an out-of-lock condition is detected.

Thus, through the single control node 84 shown in FIG. 5, the audio processing control circuit can switch the AM detector to the second control state at level 412 (FIG. 3), in which the variable band width low pass notch filters are activated and the attenuator is activated to process the signal when less than ideal input signals are received from the antenna 210. Phase locked loop control circuits 402 can pull the system into the third and fourth control states 414 and 416, in which the band width of phase locked loop 226 is widened to medium or wide band width operation in an attempt to maintain the hold on a locked channel or to re-acquire a lock when the fourth control state is reached and frequency detector 319 is activated.

Referring to FIG. 6, the circuit comprising resistors 64, 72, 76 and 78, capacitor 66, comparator 70 and inverter 80 comprise the out-of-lock detector described in the above mentioned copending patent application. Lock and band width control circuit 86 has two outputs: LOCK B, output on line 88, and WBCON output on line 90. The LOCK B signal on line 88 controls whether the I or E signal is coupled to the matrix and audio processing circuitry 233. The LOCK B signal also controls whether frequency detector 319 is activated and whether the loop filter 224 is in wide frequency band width operation. When the out-of-lock signal is present on line 88, the frequency detector 319 is activated and the loop filter is placed in the wide frequency operation. When the WBCON signal is present on line 90 and no out-of-lock signal is present on line 88, the loop filter is placed in medium frequency band width operation.

Figure 7:
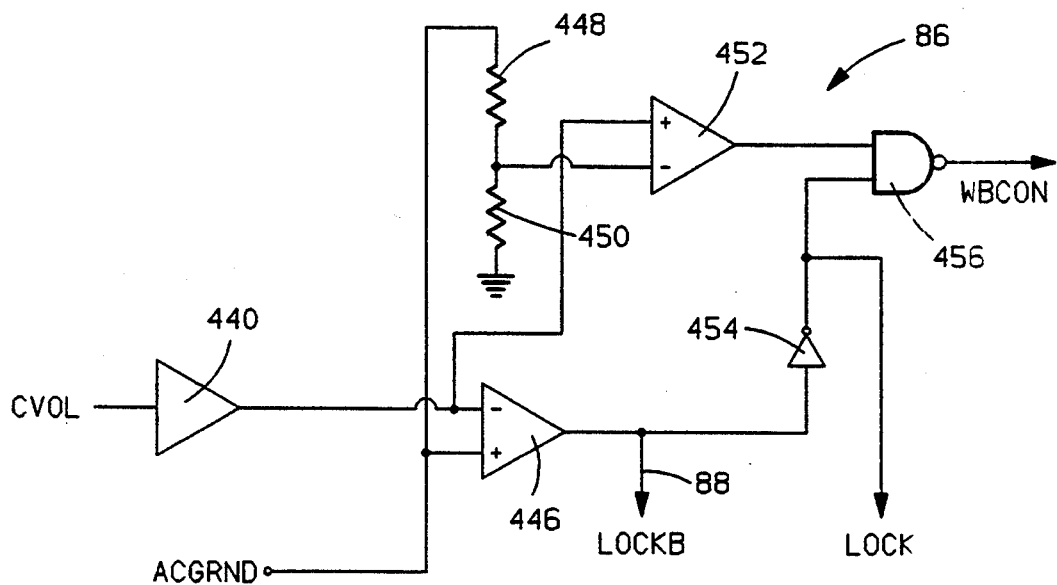
FIG. 7 is a detailed description of block 86 in FIG. 5.

Referring to FIG. 7, the lock and band width control circuit 86 is shown comprising comparators 446 and 452, resistors 448 and 450, inverter 454 and NAND gate 456. Control node 84 is coupled through buffer 440 to the inverting input of comparator 446. Comparator 446 outputs the signal, LOCK B on line 88, which is effectively an inversion of the LOCK signal output from the lock detector circuit 60,62 in FIG. 6.

Inverter 454 inverts the LOCK B signal back to the LOCK signal and provides the signal to one input of NAND gate 456. The buffered CVOL signal is also coupled to the non-inverting input of comparator 452, of which the inverting input is set to reference voltage equal to 1.5 volts by resistors 448 and 450 coupled to a 4 volt reference voltage supply line. The output of comparator 452 is equal to 1 only when the buffered CVOL signal is greater than 1.5 volts. The output of comparator 452 is coupled to the second input of NAND gate 456.

With the circuitry shown, lock and band control circuitry 86 functions as follows. During attack mode, when the voltage CVOL at node 84 is decreasing, both the WBCON and LOCK B signals are zero when the voltage is falling from 4–1.2 volts. When the voltage falls below 1.2 volts, but is still above 0.5 volts, WBCON becomes 1 and LOCK B remains 0. When the CVOL signal falls below 0.5 volts, both WBCON and LOCK B are 1.

During the slow decay when CVOL is rising, while the voltage CVOL is still below 1.2 volts, both WBCON and LOCK B are 1. When CVOL rises above 1.2 volts, but is below 1.5 volts, WBCON is 1 and LOCK B changes to zero. When CVOL rises above 1.5 volts, both WBCON and LOCK B are 0.

Figure 8:
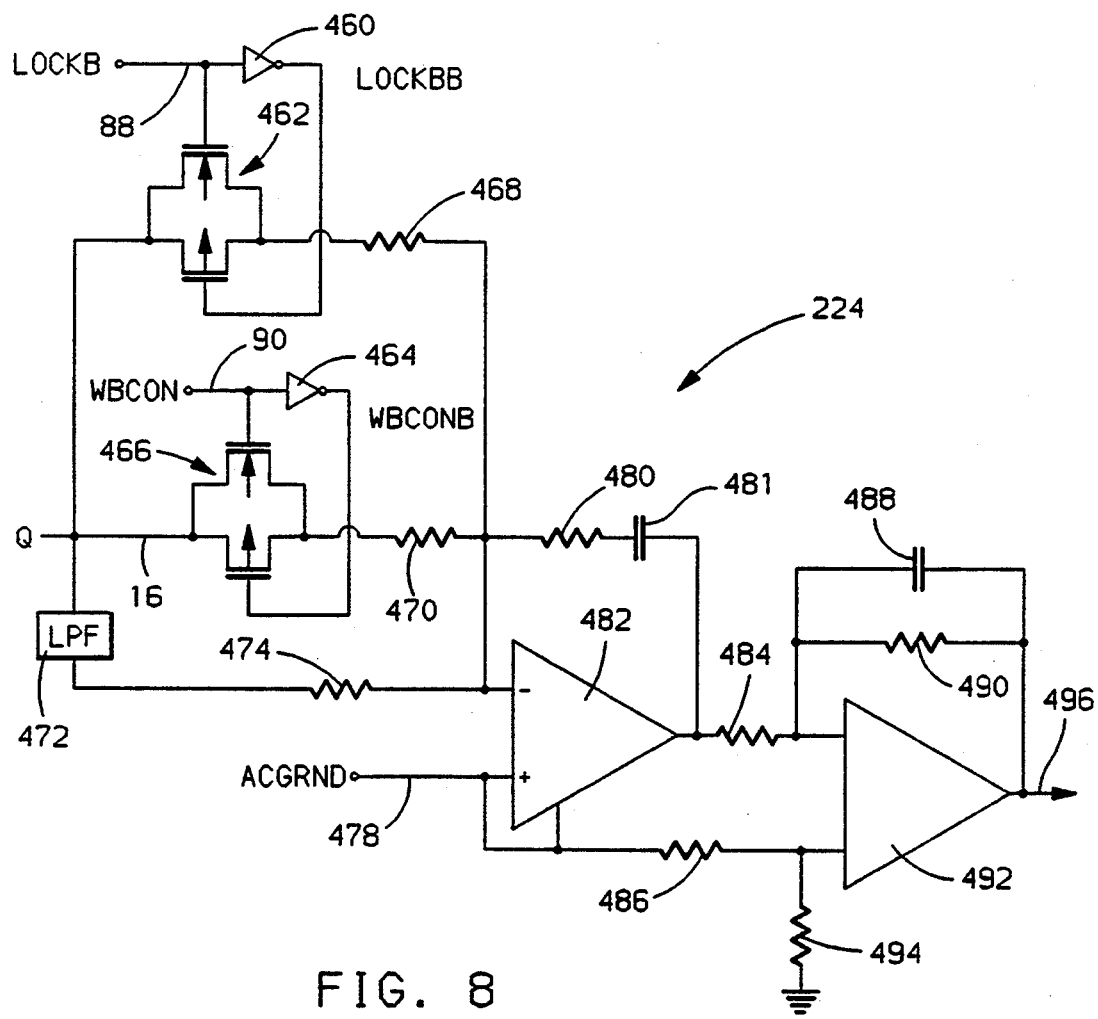
FIG. 8 is a detailed illustration of loop filter 224 in FIG. 6.

Referring to FIG. 8, a detailed schematic of loop filter 224 is shown including the circuitry necessary for band width control responsive to signals LOCK B and WBCON on lines 88 and 90. In general, the signal Q provided on line 16 passes through low pass filter 472 having a 1 kHz cutoff and is provided to amplifier 482 through resistor 474. Amplifier 482, with resistor 480 and capacitor 481, acts as a buffer and provides its output to amplifier 492, which through resistors 484, 486, 490 and 494 and capacitor 488, filters the signal Q providing the output on line 496 to VCO 222.

A supply voltage is provided to the circuit through line 478, coupled to AC ground, which is typically half the integrated circuit supply voltage (here set at 4 volts).

In the above described circuit operation, loop filter 224 has a narrow band width, desirable during a normal lock condition. When CVOL changes such that a WBCON signal is generated on line 90, inverter 464, transmission gate 466 and resistor 470 are activated to widen the filter band width of loop filter 224 to the medium band width. When the LOCK B signal is present on line 88, inverter 460, transmission gate 462 and resistor 468 are activated to widen the frequency band width of loop filter 224 to the widest possible frequency band width to enable phase locked loop 226 to re-acquire lock on the signal. The values of the resistors shown and of capacitor 488 can easily be determined by those skilled in the art to implement the desired frequency response of loop filter 224 and will vary from implementation to implementation as system constraints require.

Figure 9:
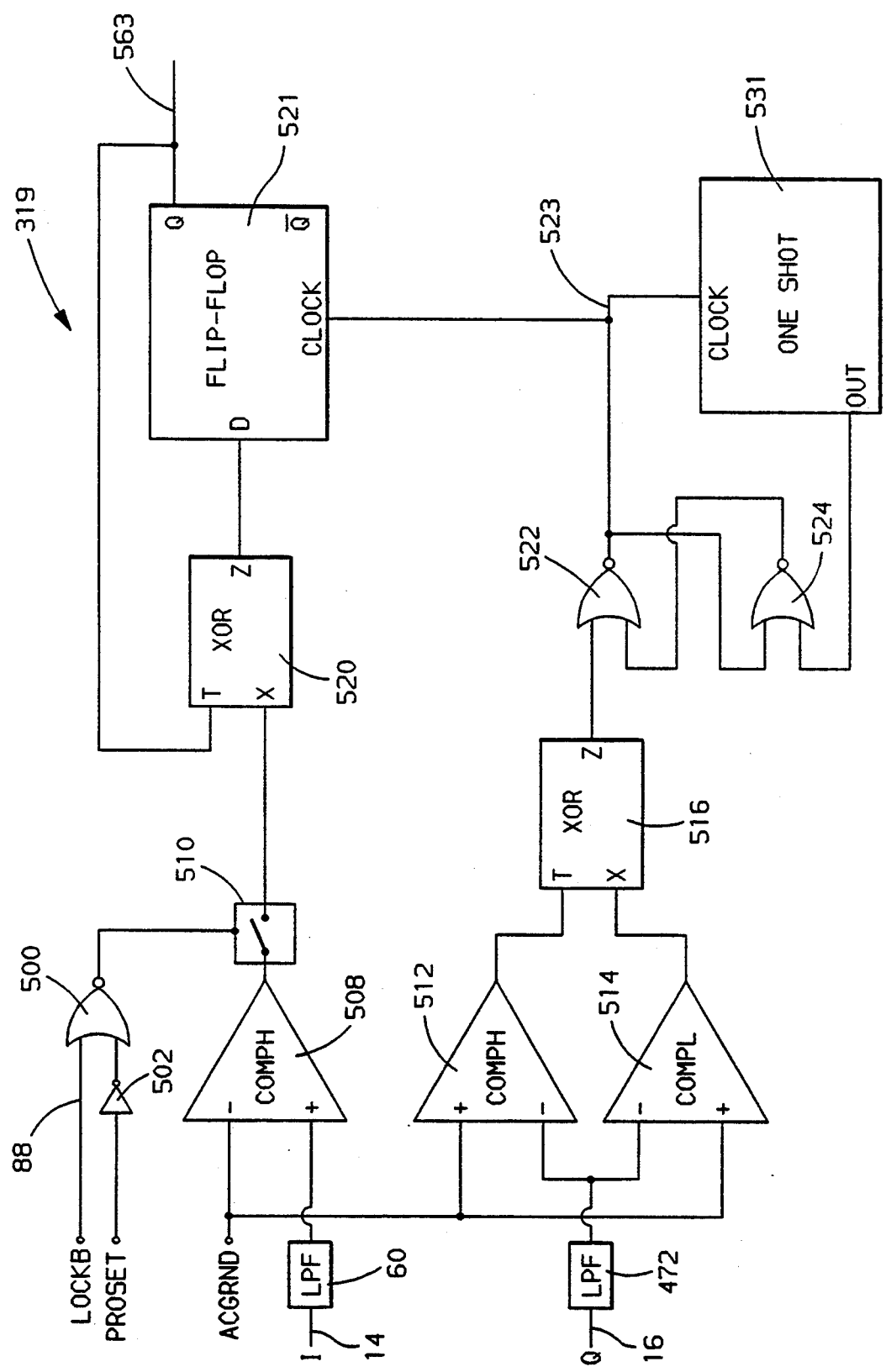
FIG. 9 is a detailed schematic diagram of frequency detector 319 in FIG. 6.

Referring to FIG. 9, the schematic shown represents a detailed implementation of frequency detector 319 with circuitry including NOR gate 500 for interfacing to the LOCK B signal on line 88. The signals I and 0 are input to frequency detector 319 from lines 14 and 16 through low pass filters 60 and 472, respectively. Comparators 512 and 514 have their non-inverting inputs coupled to reference voltage level equal to 4 volts, which is the system AC ground. Comparators 512 and 514 determine when the filtered Q signal is just above and just below AC ground and provide output signals to XOR gate 516, which outputs a signal to NOR gate 522 indicative of the zero crossing of the signal Q.

Comparator 508 compares the filtered I signal to AC ground and provides a positive output signal if the filtered I signal is above AC ground. The output of comparator 508 is enabled through transmission gate 510 from signals LOCK B and PROSET via inverter 502 and NAND gate 500.

NOR gate 524 is coupled to NOR gate 522 as shown and to one-shot 531. One-shot 531 outputs the one-shot signal to the clock input (line 523) of flip-flop 521 in response to a detected zero crossing of filtered Q output from NAND gate 522.

In general, flip-flop 521 changes the "Q" output on line 563 when I is positive (D input to flip-flop 521) at the zero crossing of the signal Q, enabling phase locked loop 226 to lock in on the IF signal with increased speed. Frequency detector 319 is disabled when a zero signal is applied to line 88 through NAND gate 500, indicating that phase lock loop 226 is in a locked condition.

Figure 10:
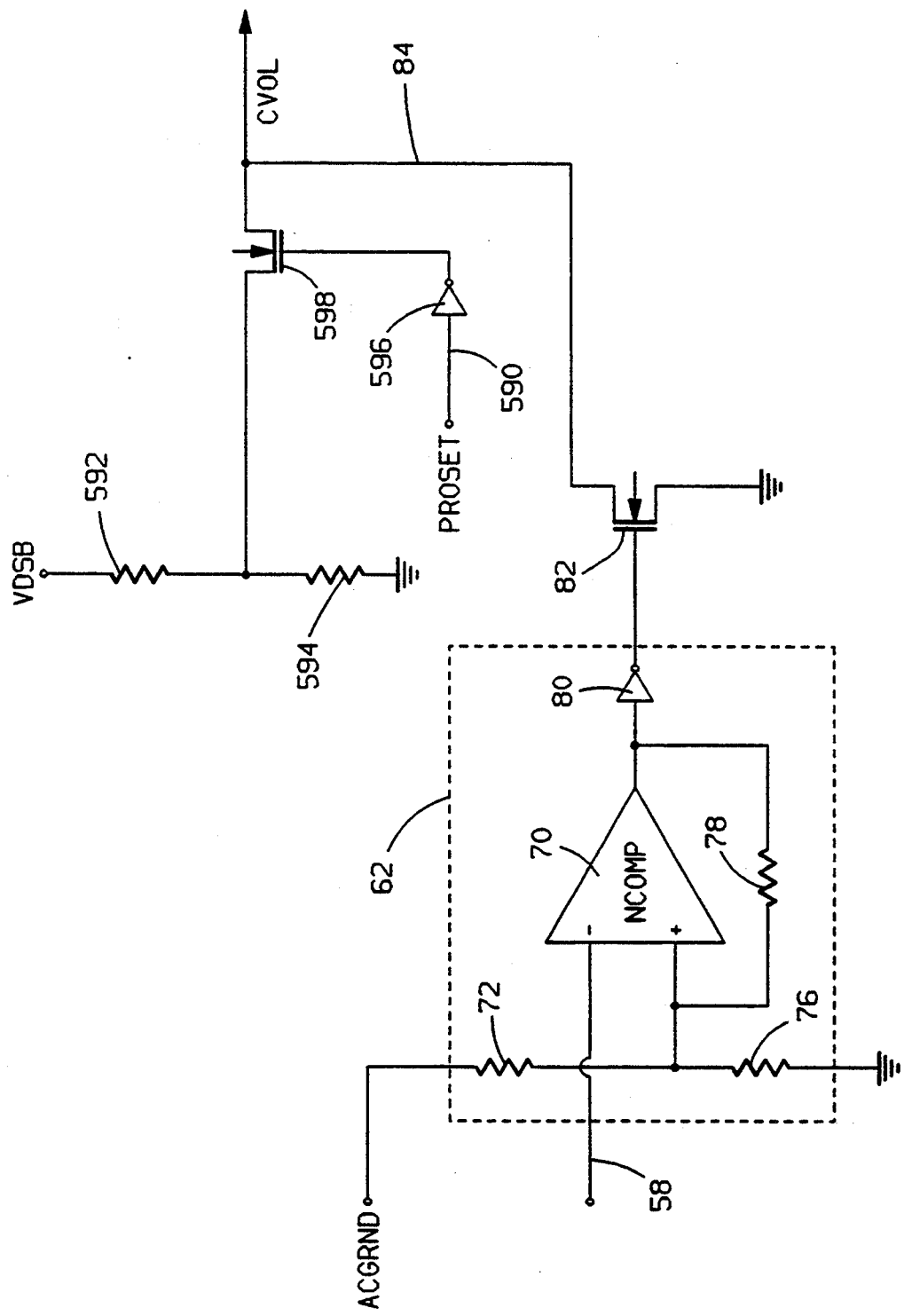
FIG. 10 is a detailed schematic of block 402 in FIG. 5.

Referring to FIG. 10, the circuitry for the out-of-lock detector, including comparator 70, and the circuitry for computer interface control of the CVOL voltage is shown. In general, the output of low pass filter 60 (FIG. 6) is coupled to line 58 and provided to one input of comparator 70. The other input of comparator 70 is coupled to a reference voltage with hysteresis by resistors 72, 76 and 78 and the output of comparator 70. The signal output by comparator 70 is inverted by inverter 80 and coupled to control node 84 by transistor 82, which, when activated, pulls CVOL down close to zero volts. The microcomputer interface is provided on line 590 and coupled through inverter 596 to transistor 598. When activated, the computer interface input controls transistor 598 to pull CVOL down to 1 volt, which voltage level is set by resistors 592 and 594.

As set forth above, this invention reduces the number of external capacitors necessary in an integrated AM stereo receiver by tying the band width control of phase locked loop 226 to control node 84 and the control voltage CVOL across capacitor 126. This advantageously eliminates the requirement of an additional external capacitor to control phase locked loop 226 as was previously known. In connection with the advantage of a reduced external component count, this invention enables the elimination of an integrated circuit pin due to the elimination of a required connection to an external component.

The circuitry blocks discussed above but not shown in detail are straight forward implementations of prior art circuitry well known to those skilled in the art and need not be set forth in detail herein. Moreover, the implementations set forth herein are example implementations and alternative embodiments performing the same functions as those embodiments set forth herein that may be achievable by those skilled in the art are considered equivalents. In addition, various improvements and modifications to this invention may be achieved by those skilled in the art and such improvements and modifications will fall within the scope of this invention as set forth below.

The embodiments of the invention in which an exclusive property or privilege is claimed are defined as follows:

1. A synchronous AM detector and processor comprising:
   an audio processor having a first filter operation controlled by a control voltage;
   an AM stereo decoder including a lock detector and a phase locked loop having a second filter operation controlled by the control voltage;
   a single control node coupled to the audio processor and the phase locked loop, the control node providing the control voltage for the audio processor and the phase locked loop;
   the voltage at the control node biased normally in a first state, capable of being pulled into a second state by the audio processing circuit and capable of being pulled to the second state by the lock detector;
   means for decaying, with a settle time, the control voltage at the control node after the control voltage has been pulled to the second state;
   means for controlling the first filter operation of the audio processing circuitry responsive to the control voltage at the control node;
   means for controlling the second filter operation of the phase locked loop in response to the control voltage level, wherein the voltage level at the control node is characterized by a fast attack and slow decay.

2. The apparatus set forth in claim 1, wherein the means for controlling the second filter operation of the phase locked loop provides a mid-range band width operation of the phase locked loop when the control voltage at the control node is pulled in a first direction past a first reference.

3. The apparatus set forth in claim 2, wherein the means for controlling the second filter operation of the phase locked loop provides a wide band width operation of the phase locked loop when the control voltage at the control node is pulled in a first direction past a second reference having a level apart in the first direction from the first reference.

4. The apparatus set forth in claim 3, wherein the means for controlling the second filter operation of the phase locked loop provides a mid-range band width operation of the phase locked loop when the control voltage at the control node settles through, in a second direction, the first reference.

5. The apparatus set forth in claim 4, wherein the means for controlling the second filter operation of the phase locked loop provides a narrow band width operation of the phase locked loop when the control voltage at the control node settles through, in the second direction, a third reference having a level apart in the second direction from the first reference.

* * * * *